US006873270B2

(12) United States Patent
Christodoulou et al.

(10) Patent No.: US 6,873,270 B2
(45) Date of Patent: Mar. 29, 2005

(54) DATA STORAGE AND ANALYSIS

(75) Inventors: Athena Christodoulou, Bristol (GB);
Richard Taylor, Bristol (GB);
Christopher Tofts, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 48 days.

(21) Appl. No.: 10/283,503

(22) Filed: Oct. 30, 2002

(65) Prior Publication Data

US 2003/0084058 A1 May 1, 2003

(30) Foreign Application Priority Data

Oct. 31, 2001 (GB) .............................. 0126209

(51) Int. Cl.[7] .............................................. H03M 7/00
(52) U.S. Cl. .......................................... 341/50; 51/107
(58) Field of Search ............................ 341/50, 51, 107

(56) References Cited

U.S. PATENT DOCUMENTS

| 5,045,852 A | * | 9/1991 | Mitchell et al. ............... 341/51 |
| 5,369,605 A | * | 11/1994 | Parks ......................... 708/210 |
| 5,471,207 A | * | 11/1995 | Zandi et al. ................. 341/107 |
| 5,640,159 A | * | 6/1997 | Furlan et al. .................. 341/51 |
| 5,870,036 A | * | 2/1999 | Franaszek et al. ............. 341/51 |
| 6,259,388 B1 | * | 7/2001 | Zhao ........................... 341/107 |

FOREIGN PATENT DOCUMENTS

EP          0717554 B1    6/2001

OTHER PUBLICATIONS

Desharnais, Josee, et al., "Metrics for Labeled Marov Systems", Proceeding of the 10th International Conference on Concurrency Theory, vol. 1664 of Lecture Notes in Computer Science, Eindhoven, Aug. 1999 (Springer–Verlag), pp. 258–273.

Neuts, Marcell F. Strcutured Stochastic Matrices of M/G/I type and Their Applications., Series: Probability Pure and Applied.5, New York, NY, Dekker 1989, pp. 420–425.

"Multivariate Discrete Phase–Type Distributions with Their Applications", Matt Goff, Department of Mathematics, Washington State University, Mar. 15, 2001, URL www.nawwal.org/mrgoff/research/proposal.html.

* cited by examiner

Primary Examiner—Jean Bruner Jeanglaude

(57) ABSTRACT

An exemplary embodiment is an apparatus for compressing data having an arbitrary probability distribution, the apparatus being configured to obtain a set of samples from said data, create a phase distribution model of said sample data set, and perform a search function adapted to select the elements forming said phase distribution model by evaluating one or more values of the elements within the model and determine those that best fit the distribution of the example data set.

18 Claims, 2 Drawing Sheets

DATA STORAGE AND ANALYSIS

FIELD OF THE INVENTION

This invention relates to data storage and analysis and, in particular, the collection, compression and storage of large amounts of data relating to the operation of a system, and the subsequent retrieval, reconstruction and analysis of such data to monitor the operation of the system and/or make predictions regarding future operation of the system.

BACKGROUND TO THE INVENTION

There are many circumstances in which it is required to monitor and analyse the operation of systems, so that any problems can be identified and solved, and predictions regarding future operation of such systems can be made. For example, it may be required to monitor the operation of a computer network consisting of tens, hundreds or even thousands of computer stations. One way to monitor such a network would be to track all data packets being transported around the system and between stations.

It will be appreciated that, as a result of such a tracking operation, an enormous amount of data is generated and, although the collected data is required for the monitoring and analysis process, it is impractical (and in many cases virtually impossible) to store such a large amount of data in an uncompressed state for subsequent retrieval and analysis because of the unacceptably large storage capacity which would be required. Obviously, therefore, it is desirable to substantially compress the data for storage and analysis, preferably without the loss of any significant information which may be essential to the accuracy of the results of the analysis process.

In known systems, the collected data is compressed and stored by assuming that it follows a particular classic probability distribution, and storing only a very few parameters determined from the collected data. For example, if only the mean and standard deviation of the collected data is calculated and stored, a probability distribution as illustrated in FIG. 1 of the drawings is obtained, which is characterised by the small number of parameters obtained from the data, the rest of the data being discarded.

However, this type of compression has a number of disadvantages associated with it. In particular, the data may not actually follow the assumed classic probability distribution (the true probability distribution of the data described by the probability distribution illustrated in FIG. 1 being shown by the broken line 100) so that the stored parameters have limited value in the analysis of the original data. Further, such data stored in the form of a summary chart gives limited reconstruction ability, i.e. it is not usually possible to reconstruct any of the original data with any accuracy, and other parameters which were not originally calculated/measured and stored cannot then be obtained if required.

Of course, it can be assumed that the parameters required from the data change periodically, for example, hourly, daily, etc. but still only a small amount of data is being stored and this still does not guarantee that the right parameters are being stored, with the result that analysis of the original data is often not as accurate and meaningful as would be required in many circumstances. In particular, problems within the system are often difficult to determine using known methods because they do not provide a precise description of the arbitrary probability distributions typical of real systems, and the resultant delay or even failure in determination of any such problems can have a devastating effect on the whole system.

In any event, such problems can only be determined by human observation, structural changes in system behaviour determined from the pattern formed by measured data, and stored parameters obtained from the original data.

We have now devised an arrangement which seeks to overcome the problems outlined above.

SUMMARY OF THE INVENTION

In accordance with a first aspect of the present invention, there is provided apparatus for compressing data having an arbitrary probability distribution, the apparatus being configured to obtain a set of samples from said data, create a phase distribution model of said sample data set, and a search function adapted to select the elements forming said phase distribution model by evaluating one or more values of the elements within the model and determine those that best fit the distribution of the example data set.

Also in accordance with the first aspect of the present invention, there is provided a method of compressing data having an arbitrary probability distribution, the method comprising the steps of obtaining a set of samples from said data, and creating a phase distribution model of said sample data set, said step of creating the phase distribution model including performing a search function adapted to select the elements forming said phase distribution model by evaluating one or more values of the elements within the model and determining those that best fit the distribution of the sample data set.

Thus, the first aspect of the present invention provides a method and apparatus for compressing data which has an arbitrary probability distribution by automatically producing a close fit phase distribution model (perhaps to within a predetermined accuracy threshold), the resultant model comprising the data suitably compressed for storage and manipulation within realistic system capacity.

In a preferred embodiment of the present invention, the resultant phase distribution model obtained from a data sample set can be further compressed by reducing the number of links therein. In the worst case, the number of links in a phase distribution model will be $x^2$, whereas in this preferred embodiment of the invention, this number can be reduced to yx, where y<x by excluding or omitting any links having very small probabilities associated with them.

This can be achieved by actually setting the value xy within the search strategy, so that the resultant phase distribution model will have no more than xy links, chosen from the possible links by including those having the highest probabilities associated therewith. It will be appreciated that xy would have to be set taking into account the maximum time allowed to compute the model and the amount of memory space available to store the compressed data. Alternatively, the same effect could be achieved by setting a minimum predetermined threshold for the required accuracy of the model. In both cases, the result is a search strategy which optimises the production of a phase distribution model, with regard to its accuracy, and the computing/storage capacity required to sustain it.

In yet another embodiment of the invention, the search strategy is further developed. The arcs or links in the phase distribution model are each assigned labels as well as the probabilities referred to above. As such, the phase distribution model can be used to represent a multi-dimensional graph, and the search strategy can be used to investigate outcomes in the phase distribution model development process other than the "finished" outcome in which the optimum phase distribution model (within a predetermined threshold) is reached. This feature can be used to identify other patterns within the data/model which may be used in more sophisticated system analysis. As a simple example, consider the character stream AAAABBAABBAAAABBB-BAABBAAAABB. In the resultant three-dimensional model describing this data, it would be possible to identify, not only that 'B' always follows the last 'A' in a string, but also that the A's and B's always appear in pairs—which may be considered good or bad depending on the nature of the system under analysis.

In accordance with a second aspect of the present invention, there is provided apparatus for analysing data consisting of measurements/calculations taken from a system during operation thereof, the apparatus being configured to obtain a set of samples from said data, analyse said sample set to define the probability distribution which at least closely describes said set, compare other samples taken from said data and for determining whether or not each of said samples lies within said probability distribution (or outside it by less than the predetermined threshold value) and return an output value accordingly.

Also in accordance with the second aspect of the present invention, there is provided a method of analysing data consisting of measurements/calculations taken from a system during operation thereof, the method comprising the steps of obtaining a set of samples from said data, analysing said sample set to define a probability distribution which at least closely describes said set, comparing other samples taken from said data, determining whether or not each of said samples lies within said probability distribution (or outside it by less than a predetermined threshold value), for returning an output value accordingly.

Thus, the second aspect of the present invention provides a way of defining an arbitrary probability distribution of the data actually collected from the system giving an accurate description thereof, with provision also being made for ongoing checking of subsequent data samples against the defined probability distribution and detection of any significant mis-match to give an early warning of the onset of structural changes in system behaviour which may be the result of significant problems or malfunction.

In accordance with a third aspect of the present invention, there is provided apparatus for compressing a data trace having an arbitrary probability distribution, the apparatus being configured to obtain a set of samples from said data, determine and store for each datum in a sample set at least the number of samples, abounded continuous probability distribution describing said sample set, a probability that a sample will lie within said probability distribution, and the values of one or more data which exceed the bounds of said probability distribution, and to reconstruct the original data trace using the stored parameters.

Also in accordance with the third aspect of the present invention, there is provided a method of compressing a data trace having an arbitrary probability distribution, the method comprising the steps of obtaining a set of samples from said data, and determining and storing for each datum in a sample set at least the number of samples, a bounded continuous probability distribution describing said sample set, a probability that a sample will lie within said probability distribution, and the values of one or more data which exceed the bound of said probability distribution, the reconstructing the original data trace from the stored parameters, if required.

The third aspect of the invention provides a way of reconstructing a sample data trace for a system using the probability distribution, the sample number, and the values of data within that set which lie outside the bound of the probability distribution. The fineness of the probability distribution and its bound can be adjusted according to particular requirements, and these values could be optimised in one preferred embodiment by a learning process applied to any particular system.

If the technique of the third aspect of the present invention is applied to the analysis process defined by the second aspect, the method beneficially includes the steps of storing data which lies within the bounds of the probability distribution in a backlist and comparing the contents of the backlist to the probability distribution, and, if the data lies outside of the bounds of the probability distribution, calculating a current running outlier probability value and comparing it to a previously-calculated and stored outlier probability. If either of the results of these comparison steps fails, in that the reference value(s) and the value(s) being compared thereto differ (at all or by more than a predetermined amount), an alert may be generated to indicate a possible structural change within the system.

In order to analyse usage patterns of the system, several probability distributions reflecting differing behaviours at different times of the day may be stored.

BRIEF DESCRIPTION OF THE DRAWINGS

An embodiment of the invention will now be described by way of example only and with reference to the accompanying drawings, in which.

DETAILED DESCRIPTION OF THE INVENTION

Figure 1:
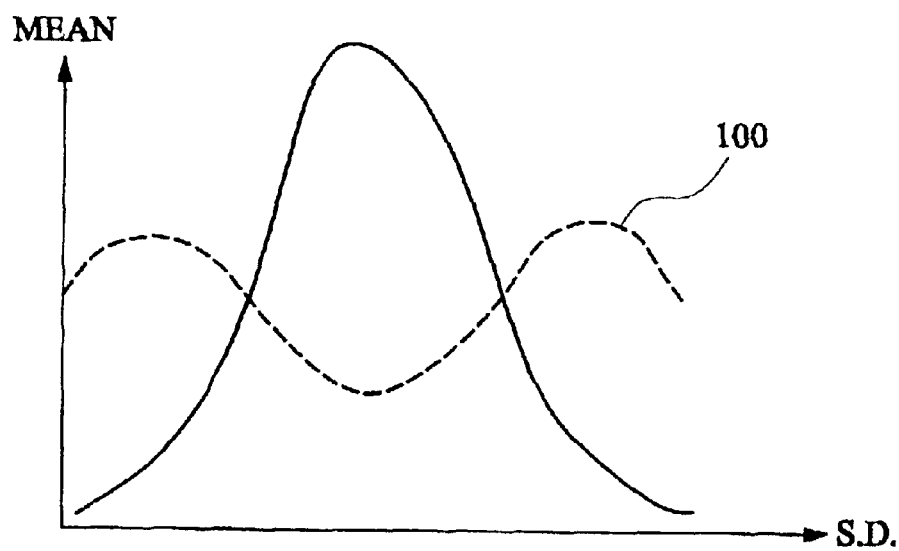
FIG. 1 is a schematic illustration of a classic probability distribution used in the prior art.
Figure 2:
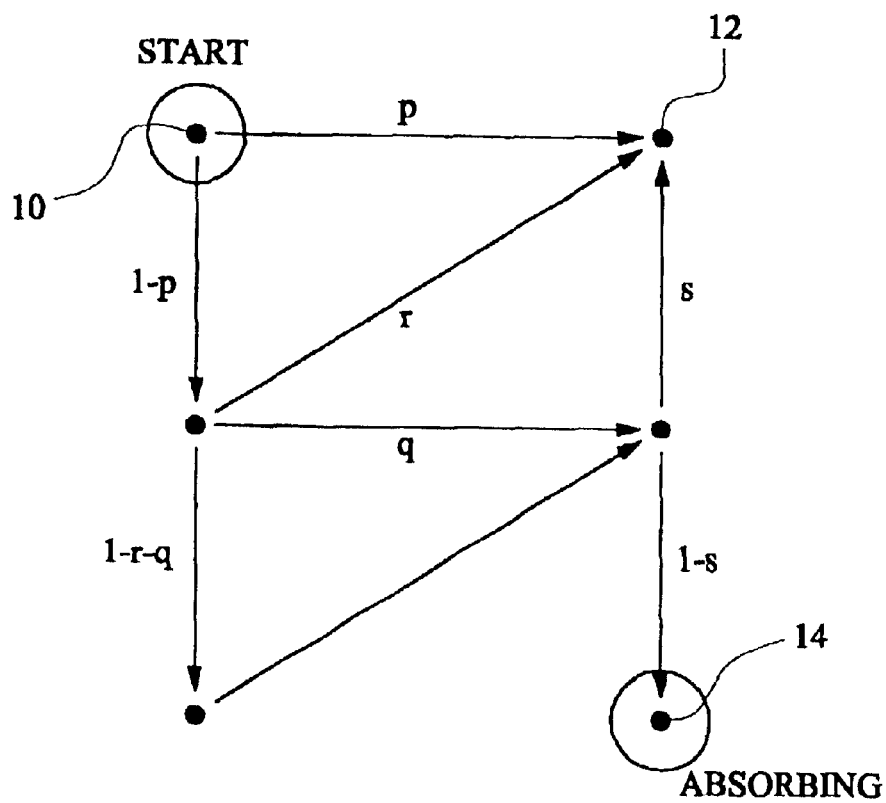
FIG. 2 is a schematic illustration of a typical phase distribution model.

It is well known to represent random probability distributions by means of a phase distribution diagram, which essentially acts as a state machine and is an effective way of compressing data whilst maintaining the ability to reconstruct the original data trace if required. Referring to FIG. 2 of the drawings, a typical phase distribution diagram is illustrated, which consists of a 'start' node or state 10, a plurality of intermediate nodes or states 12 and a final or 'absorbing' node or state 14. Each node is connected to its neighbour by an edge or arc 16, each edge or arc having a probability associated with it. Thus, a phase distribution or state diagram can be represented by a small amount of data, namely a collection of the following elements (n, p, n$^1$), where n and n$^1$ represent nodes in the diagram and p represents the probability associated with the link or arc connecting those nodes.

If the shape of the probability distribution to be represented is known, it is a relatively straightforward matter to generate an appropriate phase distribution diagram. This process is known in the art and described in great detail in such references as (1) M. F. Neuts "Matrix-Geometric Solutions in Stochastic Models", John Hopkins University Press, 1981; (2) M. F. Neuts "Structural Stochastic Matrices of M/G/1 Type and their Applications", Marcel Dekker, 1989; (3) M. F. Neuts, "Matrix-Geometric Solutions in Stochastic Models," Dover Publications, 1995; and will not be discussed in any further detail herein.

However, in the present invention, the information to be represented by a phase distribution diagram is, in fact, measured data (i.e. parameters obtained from a stream of data collected during the operation of a system), the probability distribution of which is initially unknown, and tends in any event to be arbitrary so that there is no precise definition or conversion process therefor.

One way to convert the measured data into a phase distribution diagram is by calculation, a process which in itself is also known in the art (see, for example, the above-mentioned references), and will not be discussed in any further detail herein. However, the generation of phase diagrams using this calculation process is effectively limited to around x<5, where x is the number of possible links in the state diagram.

Thus, in a preferred embodiment of the present invention, a search function, such as hill climbing, simulated annealing, genetic algorithms and the like, is used to generate phase distribution diagrams from the measured data in any particular situation. Such search functions, the principles of which are generally known and used in other fields, act to perturb the measured data into sets of $(n, p, n^1)$ using a particular strategy. Different values for p may be tried and the 'fit' evaluated using any suitable means, with the end of the search procedure resulting in a good close fit phase model. It will be appreciated that, for the purposes of the search strategy, p need not necessarily be a direct representation of probability, but instead an arbitrary value k may be used and interpreted as probability later.

By way of example, consider the arbitrary data stream:

aabaaababbaaabaabaabbaaabaabbaaba . . . etc (up to 1000 or more symbols) collected from a system under analysis.

Consider a phase distribution model having four states SØ, S1, S2 and S3. One might start with the model:

SØ=pØØ. A: SØ+pØ1. a:S1+pØ2. a:S2+pØ3. a:S3
S1=p1Ø. a:SØ+p11. a:S1+p12. a:S2+p13. a:S3
S2=p2Ø. b:SØ+p21. b:S1+p22. b:S2+p23.b:S3
S3=P3Ø. b:SØ+p31. b:S1+p32. b:S2+p33. b:S3

It will be appreciated, of course, that more than four states can be used.

This model can be used to compute, for example, the probability distribution for a.b. subsequences, moments for distributions, a sequence of actions (so that the trace distance can be measured), or any other suitable characteristic of the data stream under consideration. The computed characteristic is compared against the same characteristic calculated from the data stream itself, to determine the accuracy of the model.

Thus, in order to compute the desired characteristic of the data using the above-defined model, values are assigned for (pØØ, pØ1, pØ2, pØ3, p1Ø, p11, p12, p13, p2Ø, p21, p22, p23, p30, p31, p32, p33) and the characteristic is computed accordingly. If, when the characteristic computed using the above-defined model and the assigned values of p is compared against the same characteristic calculated from the data stream itself, it is not found to adequately match (to within some predetermined threshold), the values assigned to (pØØ, pØ1, . . . p33) are changed, and the computation and comparison steps are repeated.

The above process is repeated until the best phase distribution model is arrived at, for example:

SØ=(0.2). a:SØ+(0.8).a:S1
S1=(0.8). a:SØ+(0.1).a:S2+(0.1).a:S3
S3=(0.5).b:S1+(0.5). b:S3.

Ø=zero which phase distribution model is then stored.

The process described above for determining an "optimum" phase distribution model for the data stream is performed, in accordance with the present invention, using a search function. There are many different types of suitable search function known in the art, such as hill climbing, simulated annealing and genetic algorithms, for example. The search functions all operate to perturb the measured data into the phase distribution model by changing the assignment of values of (pØØ, pØ1 . . . p33) according to some particular strategy.

Once a phase distribution model for the system is defined and stored, it can be used in the analysis of that system. For this purpose, another data stream abbaabbbaabbabbaaabbb . . . etc. (again up to 1000 or more symbols) is collected, and its phase distribution model calculated using the process described above. The new phase distribution model, for example:

TØ=(0.21). a:TØ+(0.79). a:T1
T1=(0.5). a:TØ+(0.5). a:T2
T2=(0.5). b:T1+(0.5). b:T3
T3=(0.3). b:T2+(0.7). b.T3 is compared against the stored phase distribution model for the system to detect any problems in the system. Such error detection may be achieved by eye, i.e. manual comparison of graphical representations of the stored and new phase distribution models. In another embodiment of the invention, one or more predetermined characteristics of the data (as referred to above with reference to obtaining the "best fit" phase distribution model of the system) may be computed using the new model and compared against similar characteristic(s) computed using the stored model, with significant differences or variations from expected values indicating a potential problem. This comparison may be done manually or automatically. In yet another embodiment of the invention, the error analysis may be achieved using a known technique called "automata theoretic measures of distance", as described in detail in "Metrics for Labeled Markov Systems", J. Deshamais, V. Gupta, R. Jagadeesan and P. Penangaden, Proceedings of the 10th International Conference on Concurrency Theory (editors: J. C. M. Baeten and S. Mauw), volume 1664 of Lecture Notes in computer Science, Eindhoven, August 1999 (Springer-Verlag).

Another advantage of the present invention lies in the fact that the original data trace can be recovered by simply storing the phase distribution model, the number of samples used to obtain the phase distribution model, and an indication of the samples which lie outside the model (and by how much). This is again facilitated by the ability to define the phase distribution model of a data stream in the first place. Relatively few of the samples will fall outside the phase distribution model (which is, in any event, driven by the data itself), making it a practical option to store those that do; whereas in known systems, where the data is fitted into a predefined distribution model, a large number of individual datum will fall outside the distribution model, making it impractical and pointless to store individual indications of each.

Figure 3A:
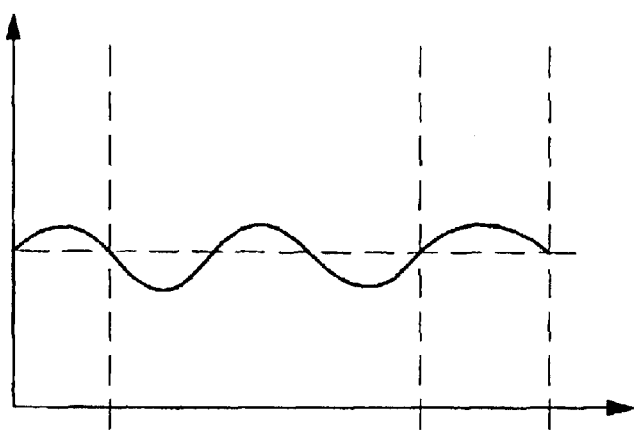
FIGS. 3A–3C are schematic illustrations of exemplary probability distributions relating to a system.
Figure 3B:
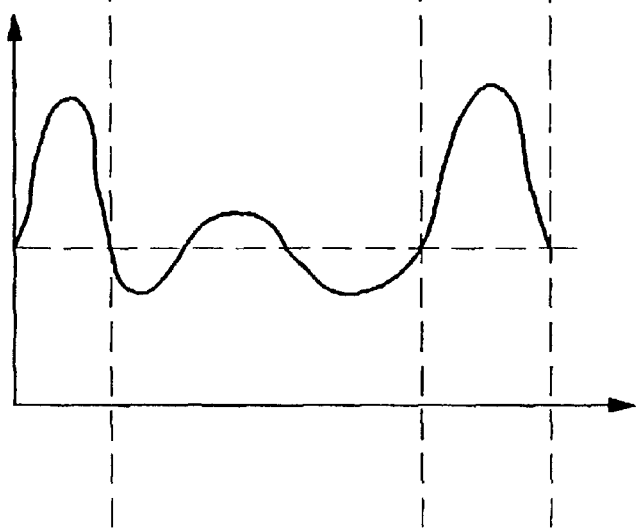
Figure 3C:
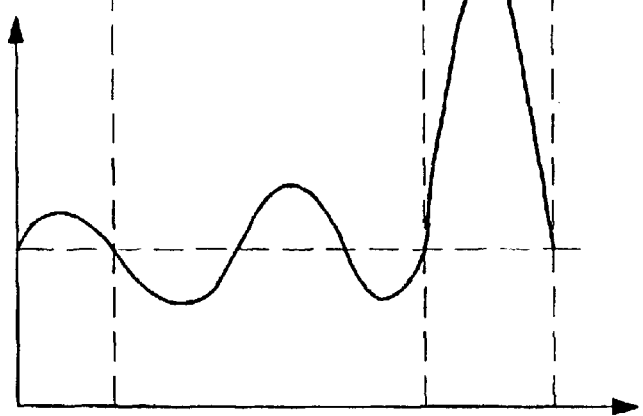

As an example of some of the advantages of the present invention, consider FIGS. 3A–3C of the drawings, which illustrate some of the patterns which may appear using the technique of the present invention. Referring first to FIG. 3A of the drawings, an exemplary probability distribution representing substantially normal operation of a particular system is illustrated. As stated above, the sampled data is compared with this probability distribution and, if the samples start to deviate therefrom by more than a predetermined amount, the apparatus may be arranged to generate an output to alert system operators of a potential problem.

Referring now to FIG. 3B, the illustrated distribution of the same system indicates the situation whereby the system is either operating very well (indicated by the left-hand peak) or very badly (indicated by the right-hand peak), but rarely falls anywhere in between the two extremes (as indicated by the very small central peak). This pattern may indicate a problem requiring action or simply highlight a change in traffic distribution, for example, depending on the type of system under analysis. A further transition of the process may result in the pattern shown in FIG. 3C, which shows that the left hand peak has shrunk, whereas the right hand peak has grown. This would certainly seem to indicate a substantial deterioration in the performance of the system, which would require investigation and rectification.

It will be understood that the prior art two-parameter distributions for each of the three situations described with reference to FIGS. 3A–3C would barely vary in form, and would therefore fail to highlight any problems, possibly until much later when the system operation has deteriorated much more detrimentally. The present invention provides the opportunity for much more detailed and accurate analysis of collected data (for tracking, for example, the load on a system) and even small, subtle changes in its probability distribution (indicating possible problems within the system) can be identified quickly and accurately, and rectified if necessary. In addition, this type of analysis can be used to accurately predict future system requirements.

In a preferred embodiment of the present invention, the resultant phase distribution model obtained from a data sample set can be further compressed by reducing the number of links therein. In the worst case, the number of links in a phase distribution model will be $x^2$, whereas in this preferred embodiment of the invention, this number can be reduced to yx, where y<x by excluding or omitting any links having very small probabilities associated with them.

This can be achieved by actually setting the value xy within the search strategy, so that the resultant phase distribution model will have no more than xy links, chosen from the possible links by including those having the highest probabilities associated therewith. It will be appreciated that xy would have to be set taking into account the maximum time allowed to compute the model and the amount of memory space available to store the compressed data. Alternatively, the same effect could be achieved by setting a minimum predetermined threshold for the required accuracy of the model. In both cases, the result is a search strategy which optimises the production of a phase distribution model, with regard to its accuracy, and the computing/storage capacity required to sustain it.

In yet another embodiment of the invention, the search strategy is further developed. The arcs or links in the phase distribution model are each assigned labels as well as the probabilities referred to above. As such, the phase distribution model can be used to represent a three-dimensional graph, and the search strategy can be used to investigate outcomes in the phase distribution model development process other than the "finished" outcome in which the optimum phase distribution model (within a predetermined threshold) is reached. This feature can be used to identify other patterns within the data/model which may be used in more sophisticated system analysis. As a simple example, consider the character stream AAAABBAABBAAAABBB-BAABBAAAABB. In the resultant three-dimensional model describing this data, it would be possible to identify, not only that 'B' always follows the last 'A' in a string, but also that the A's and B's always appear in pairs—which may be considered good or bad depending on the nature of the system under analysis This process may be facilitated by means of a so-called Markov reward process in which the phase distribution model comprises a number of nodes or states, an array of transition probabilities associated with associated links or arcs connecting the nodes and an array of rewards also associated with the links or arcs, which essentially results in a multi-dimensional model having different outcomes depending on the criteria defined therefor. The Markov reward process is known in the field of statistics, and will therefore not be described in any further detail herein.

In summary, the present invention involves the use of search means to convert X number of data samples into a phase distribution model, which is a compressed version of the original data which has a high reconstruction ability if required. One of the most significant features of this is the fact that the search process is adapted to optimise the phase distribution model. As a result, the original data can be effectively compressed, with a much reduced chance of retaining (i.e. not destroying) the ability to reconstruct data which may be required later for future reference and/or future predictions. For these purposes, producing and storing a classic probability distribution consisting of only the mean and standard deviation of the data, as in the prior art. Further, the ability to detect subtle (sometimes short term) changes in the distribution of the data using the phase distribution model created by the search function, the present invention provides an automated means for identifying what might at least potentially be problems within a system, as well as facilitating system load distribution or capacity planning and prediction of future performance and requirements.

In general, with known methods of simulation and system modelling, the process starts with a predefined theoretical distribution from which the data is drawn, and appropriate parameters are measured and substituted into the distribution. In contrast, the method and apparatus of the first and second aspects of the present invention is capable of expressing any theoretic distribution, and allow the data to drive the choice of model used. As a result, error analysis functions can be automated, and the need for skilled manual analysis of the data prior to modelling to determine a potentially suitable distribution is eliminated.

In the foregoing specification, the invention has been described with reference to specific exemplary embodiments thereof It will, however, be apparent to a person skilled in the art that various modifications and changes may be made thereto without departing from the broader spirit and scope of the invention as set forth in the appended claims. Accordingly, the specification and drawings are to be regarded in an illustrative, rather than a restrictive, sense.

What is claimed is:

1. Apparatus for compressing data having an arbitrary probability distribution, the apparatus being configured to obtain a set of samples from said data, create a phase distribution model of said sample data set, and perform a search function adapted to select the elements forming said phase distribution model by evaluating one or more values of the elements within the model and determine those that best fit the distribution of the example data set.

2. Apparatus according to claim 1, wherein the resultant phase distribution model obtained from the data sample is further compressed by reducing the number of links therein.

3. Apparatus according to claim 2, wherein the number of links is reduced from X2 to YX, where Y is less than X, by excluding or omitting any links having very small probabilities associated with them.

4. Apparatus according to claim 3, wherein the value XY is set within the search strategy.

5. Apparatus according to claim 3, wherein the value XY is defined by setting a minimum predetermined threshold for the required accuracy of the model.

6. Apparatus according to claim 5, wherein the arcs or links in the phase distribution model are assigned labels, as well as said probabilities, such that said phase distribution model can be used to represent a three-dimensional phase and the search strategy can be used to investigate outcomes in the phase distribution model development process other than the final outcome in which the optimum phase distribution model is reached.

7. A method of compressing data having an arbitrary probability distribution, the method comprising the steps of obtaining a set of samples from said data, and creating a phase distribution model of said sample data set, said step of creating the phase distribution model including performing a search function adapted to select the elements forming said phase distribution model by evaluating one or more values of the elements within the model and determining those that best fit the distribution of the sample data set.

8. A computer program configured to carry out the method of claim 7.

9. A method according to claim 7, including the step of further compressing the resultant phase distribution model by reducing the number of links therein from X2 to XY, where Y is less than X by excluding or omitting any links having very small probabilities associated with them.

10. A method according to claim 9, including the step of setting the value XY within the search strategy.

11. A method according to claim 9, including the step of setting a minimum predetermined threshold for the required accuracy of the model.

12. A method according to claim 7, including the step of assigning labels to each of the arcs or links in the phase distribution model such that the phase distribution model can be used to represent a multi-dimensional graph, and the search strategy can be used to investigate the outcome in the phase distribution model development process other than the final outcome in which the optimum phase distribution model is reached.

13. Apparatus for analysing data consisting of measurements/calculations taken from a system during operation thereof, the apparatus being configured to obtain a set of samples from said data, analyse said sample set to define the probability distribution which at least closely describes said set, compare other samples taken from said data and for determining whether or not each of said samples lies within said probability distribution (or outside it by less than the predetermined threshold value) and return an output value accordingly.

14. A method of analysing data consisting of measurements/calculations taken from a system during operation thereof, the method comprising the steps of obtaining a set of samples from said data, analysing said sample set to define a probability distribution which at least closely describes said set, comparing other samples taken from said data, determining whether or not each of said sample lies within said probability distribution (or outside it by less than a predetermined threshold value) and returning an output accordingly.

15. A computer program configured to carry out the method of claim 14.

16. Apparatus for compressing a data trace having an arbitrary probability distribution, the apparatus being configured to obtain a set of samples from said data, determine and store for each datum in a sample set at least the number of samples, abounded continuous probability distribution describing said sample set, a probability that a sample will lie within said probability distribution, and the values of one or more data which exceed the bounds of said probability distribution, and to reconstruct the original data trace using the stored parameters.

17. A method of compressing a data trace having an arbitrary probability distribution, the method comprising the steps of obtaining a set of samples from said data, and determining and storing for each datum in a sample set at least the number of samples, abounded continuous probability distribution describing said sample set, a probability that the sample will lie within said probability distribution, and the values of one or more data which exceeds the bounds of said probability distribution, and reconstructing the original data trace using the stored parameters, if required.

18. A computer program configured to carry out the method of claim 17.

* * * * *